(12) United States Patent
Lin

(10) Patent No.: US 7,236,061 B2
(45) Date of Patent: Jun. 26, 2007

(54) TEMPERATURE COMPENSATED REFRESH CLOCK CIRCUIT FOR MEMORY CIRCUITS

(75) Inventor: Yung Feng Lin, Hsinchu (TW)

(73) Assignee: Macronix International Co., Ltd. (TW)

( * ) Notice: Subject to any disclaimer, the term of this patent is extended or adjusted under 35 U.S.C. 154(b) by 105 days.

(21) Appl. No.: 11/121,355

(22) Filed: May 3, 2005

(65) Prior Publication Data

US 2006/0250159 A1 Nov. 9, 2006

(51) Int. Cl.
*G01K 7/00* (2006.01)
*H03K 3/02* (2006.01)

(52) U.S. Cl. .................. 331/66; 331/143; 327/291

(58) Field of Classification Search ............. 331/57, 331/66, 74–75, 173, 177 R, 185–186, 111, 331/143; 327/291, 534–537
See application file for complete search history.

(56) References Cited

U.S. PATENT DOCUMENTS

| 5,499,213 A | * | 3/1996 | Niimi et al. ............... 365/222 |
| 5,754,476 A | | 5/1998 | Caser et al. |
| 6,163,225 A | | 12/2000 | Sundaram et al. |
| 6,373,324 B2 | | 4/2002 | Li et al. |
| 6,621,326 B1 | | 9/2003 | Le |

OTHER PUBLICATIONS

B. Keeth, et al. "CMOS Transconductor VCO with Adjustable Operating and Centre Frequencies", *Electronics Letters*, vol. 31, No. 17, pp. 1397-1398, Aug. 1995.

* cited by examiner

*Primary Examiner*—David Mis
(74) *Attorney, Agent, or Firm*—Knobbe, Martens, Olson & Bear LLP

(57) ABSTRACT

A memory circuit that generates a positive temperature correlated clock frequency is described. One embodiment includes a voltage reference having a voltage determined at least in part by a diode or transistor having a negative temperature coefficient. A clock generator generates a clock having a frequency that is based at least in part on the voltage reference voltage so that the clock frequency has a positive temperature correlation. A memory charge pump is enabled at least in part by the clock.

41 Claims, 3 Drawing Sheets

TEMPERATURE COMPENSATED REFRESH CLOCK CIRCUIT FOR MEMORY CIRCUITS

BACKGROUND OF THE INVENTION

1. Field of the Invention

The present invention relates generally to clocking circuits, and in particular, to methods and apparatus for a refresh clock generator.

2. Description of the Related Art

Flash Electrically Erasable Programmable Read-Only Memory (flash memory or Flash EEPROM memory) is a nonvolatile memory including EEPROM cells, wherein an EEPROM cell retains a programmed value, such as a logical one or a logical zero, even when power is removed from the circuitry. Flash memory conventionally utilizes a floating gate MOS field effect transistor having a drain region, a source region, a floating gate, and a control gate. Conductors are respectively connected to the drain, source, and control gate for applying signals to the transistor.

A standby charge pump is conventionally utilized to generate a wordline voltage for a read operation. The sustained capacitance can be made up from gates, junctions and wells. However, the capacitance charge tends to leak over time, such as when in a power down or stand by mode. For example, the reverse bias junction diode and well have leakage current, where the leakage current is temperature dependent. At times it may be necessary to periodically re-fill the sustaining capacitor for the leaked charge after a period of time or when coming out of a power down or stand by mode, wherein the timing can be set by a refresh clock generator.

Because of the leakage, and resulting low wordline voltage, conventionally the first read after coming out of a power-down or standby mode may disadvantageously fail. While there have been attempts to compensate for such temperature dependencies in leakage current using a variety of circuits, these compensating circuits often rely on a resistor having a negative temperature coefficient that forms the resistor portion of an RC (resistor-capacitor) circuit used in a clocked circuit to control the clock period. However, it is difficult to fabricate a resistor from polysilicon having the desired large and controllable negative temperature coefficient using many common processes, and so such a compensation circuit may not be practical to implement for many applications.

SUMMARY OF THE INVENTION

Methods and apparatus are described herein related to generating a positive temperature correlated clock frequency utilizing a diode having a positive temperature correlation.

In one embodiment, an example memory circuit that generates a positive temperature correlated clock frequency comprises: a voltage reference having a voltage defined at least in part by a diode or a transistor having a negative temperature coefficient; a clock generator that generates a clock having a frequency that is based at least in part on the voltage set by the voltage reference so that the clock frequency has a positive temperature correlation; and a memory charge pump enabled at least in part by the clock.

In another embodiment, an example memory device comprises: a voltage reference having a voltage defined at least in part by a diode having a negative temperature coefficient; and a clock generator that generates a clock having a frequency that is based at least in part on the voltage reference voltage so that the clock frequency has a positive temperature correlation.

In yet another embodiment, an example flash memory device comprises: EEPROM cells; a plurality of wordlines coupled to the EEPROM cells; a standby charge pump coupled to the wordlines to generate a wordline voltage for a read operation; a voltage reference having a voltage defined at least in part by a diode having a negative temperature coefficient; and a clock circuit that provides a clock having a temperature dependent refresh period and a temperature dependent standby period based at least in part on the voltage reference voltage.

BRIEF DESCRIPTION OF THE DRAWINGS

Exemplary embodiments of the present invention are illustrated in the accompanying drawings, which are for illustrative purposes only. The drawings comprise the following figures, in which like numerals indicate like parts.

DETAILED DESCRIPTION OF PREFERRED EMBODIMENTS

Methods and apparatus are described herein related to generating a positive temperature correlated clock frequency utilizing a temperature compensated voltage reference. While, for illustrative purposes, the following description will focus on flash memory, the methods and apparatus described herein can be used for other memory types, such as other memories having standby and power-down modes.

In a flash memory array, the memory cells may be arranged in a rectangular array of rows and columns to form intersections at which there are disposed memory cell transistors. The drain of each transistor is connected to a corresponding bit line, the source of each transistor is connected to an array source voltage by an array source line, and the gate of each transistor is connected to a wordline. There may be large numbers of decoders coupled to wordlines for addressing the memory cells.

The leaked charge from the combined decoders can be relatively large. The leakage can be from the sustaining capacitance formed by MOS transistors gates, junctions and wells. For example, a reverse bias junction diode and well have associated leakage currents. The degree of leakage is positively related to temperature. By way of example, certain silicon data shows the leakage current difference can increase by about two orders of magnitude from room temperature (25° C.) to 85° C. Hence, there is a need to turn on the charge pumps and reference voltage generators to refill the sustaining capacitance pool more often at high temperatures to compensate for the higher discharge rate. Otherwise, as in many conventional flash memories, because of charge leakage and the resulting low wordline voltage, conventionally the first read after coming out of a power-down or standby mode may fail, especially at high temperatures when the leakage is relatively higher.

Figure 1:
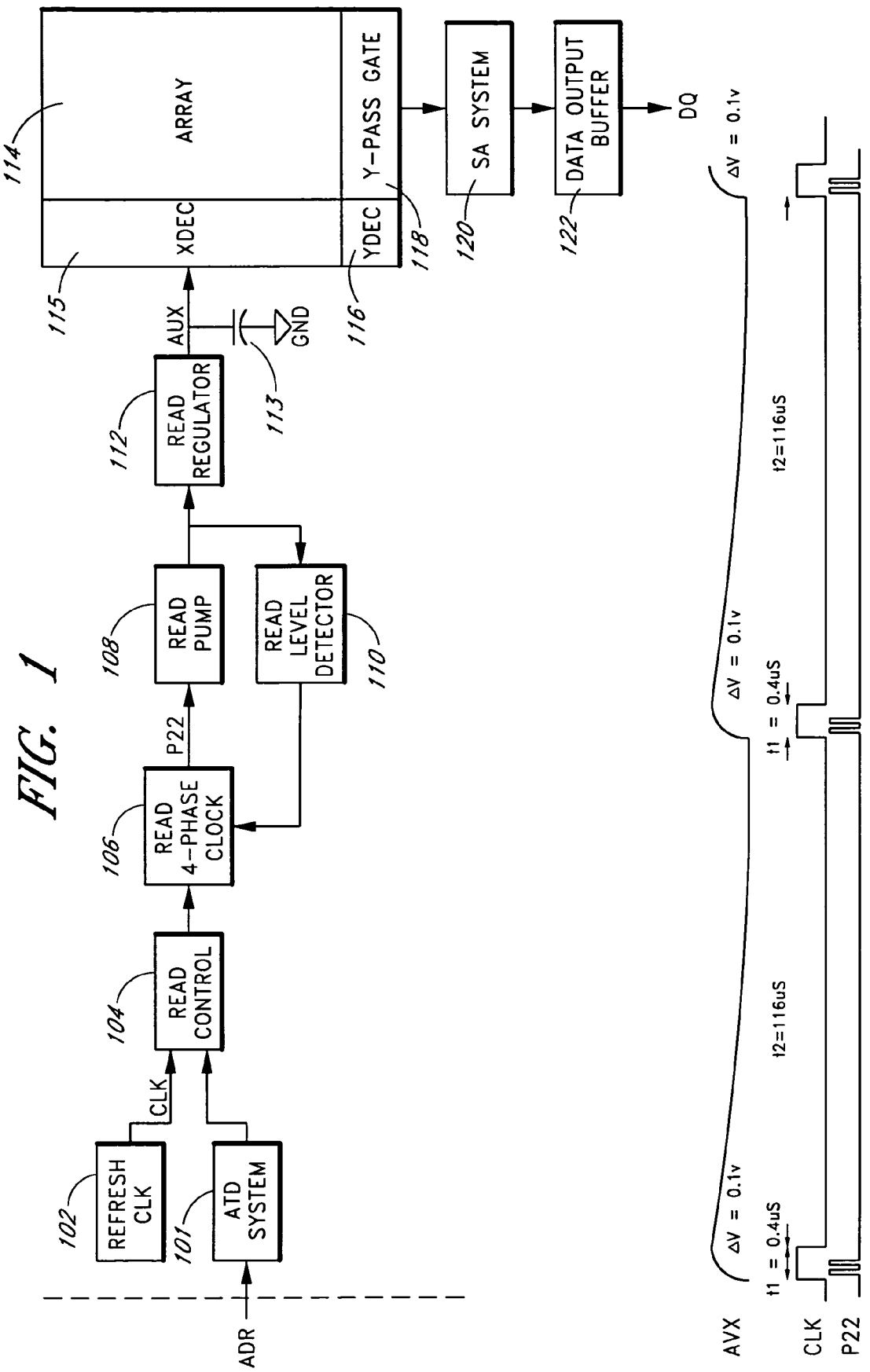
FIG. 1 illustrates a block diagram of an example memory circuit.

FIG. 1 illustrates an example flash memory including an example temperature compensated refresh circuit which enables the refresh, refill process to occur with a greater frequency as the operating temperature increases.

In the example flash memory illustrated in FIG. 1, a refresh clock circuit 102 and a address transition detector (ATD) 101 are connected to a read control circuit 104. The read control circuit is, in turn, connected to a read 4-phase clock circuit 106 having an output P22 coupled to a read pump circuit 108. The read pump circuit 108 is coupled to a read level detector 110 and to a read regulator 112. The read level detector 110 provides feedback to the read 4-phase clock circuit 106. The read regulator 112 has an output AVX that is AC coupled to a ground via a capacitor 113, and to an X decoder circuit 115. The X decoder circuit 114 is coupled to a memory array 114 via wordlines. A Y decoder circuit 116 is coupled to a Y-pass gate 118. The Y-pass gate is coupled to a sense amplifier (SA) system 120. The SA system 120 is coupled to a data output buffer 122, which outputs the Data bus DQ The read pump 108 can include a positive charge pump which is used to generate a wordline voltage for a read operation by correspondingly providing needed negative and positive regulated voltages to the X-decoders 115, coupled to the memory array 114 via wordlines. The memory array 114 can, for example, include non-volatile flash/EEPROM memory cells. The read charge pump 108 is turned off a substantial portion of the time while in a standby or power-down mode to reduce power consumption. When the charge pump 108 is turned off, the positive and negative read nodes discharge due to leakage. Periodically, the charge pump 108 is turned on to charge or refresh the sustaining capacitance, including positive and/or negative nodes, toward the operational read level voltages. In one embodiment, the refresh process enables the flash device to enter the 'read mode' as soon as there is a read request even while the flash device is in standby/deep power-down mode, or is coming out of a reset.

The refresh clock circuit 102 is used during standby mode to generate periodic pulses at appropriate frequencies with appropriate pulse widths for turning on the charge pumps and/or certain voltage reference generating circuits, which otherwise would be off during standby mode to save power. In order to better compensate for the temperature dependencies of the charge leakage, the clock frequency has a positive temperature coefficient. A higher frequency is desired at higher temperatures because the leakage current is greater at high temperature and the charge pump 108 needs to be turned on more often than at low temperatures to refresh the nodes to the appropriate operational read potentials.

In order to compensate for such temperature dependency, in an example embodiment, the refresh clock circuit 102 is utilized to count or set the time period for refilling the sustaining capacitor, wherein the clock generator frequency has a positive temperature dependency. The refresh clock circuit 102 thereby causes the sustaining capacitor to be refilled or charged with a greater frequency as the temperature increases. This enables a more stable wordline read level voltage to be maintained across the typical or desired operating temperature range, and can reduce or eliminate the first read fail after coming out of a standby or power down mode.

Figure 2A:
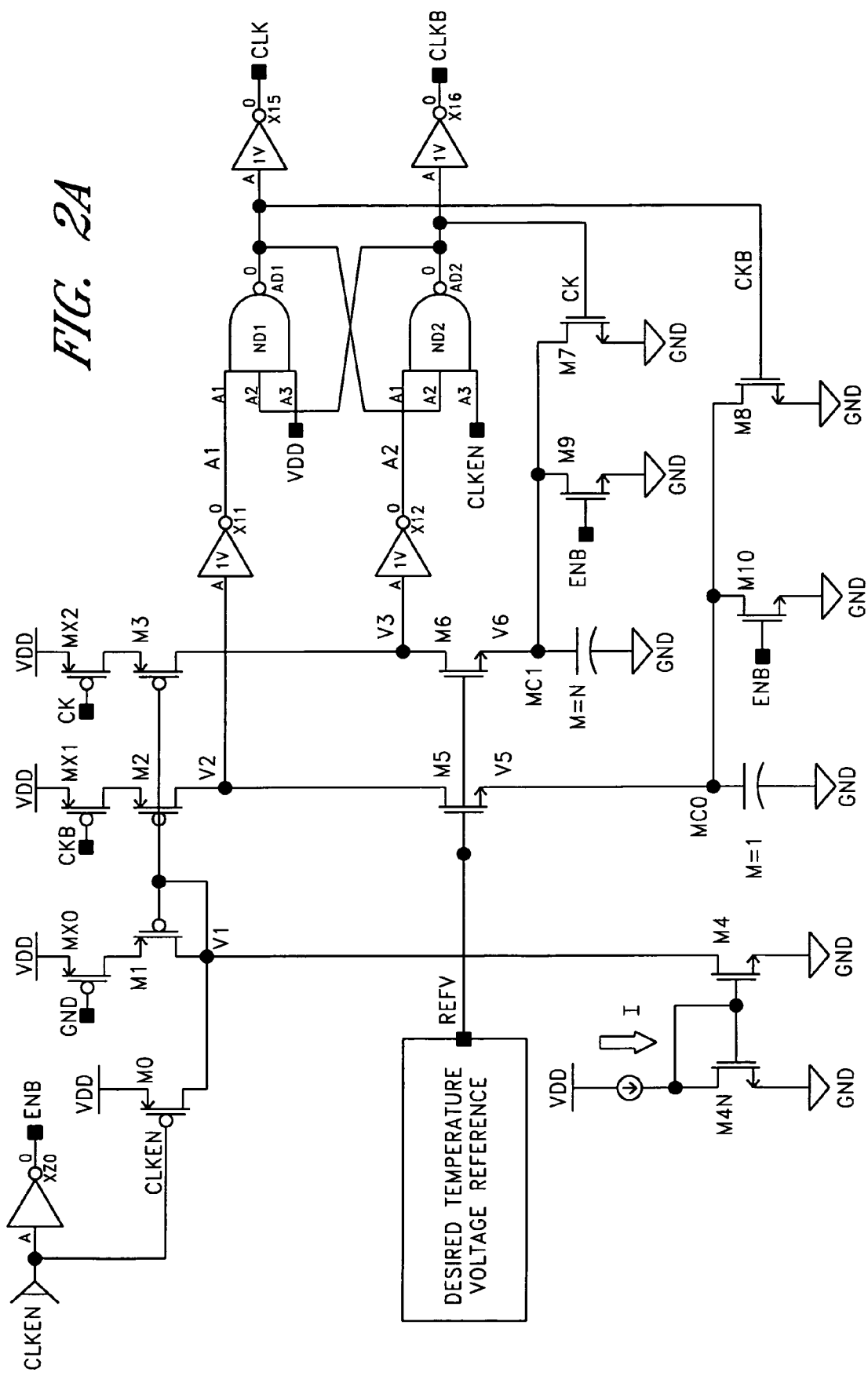
FIG. 2A illustrates an example clock generator circuit.
Figure 2B:
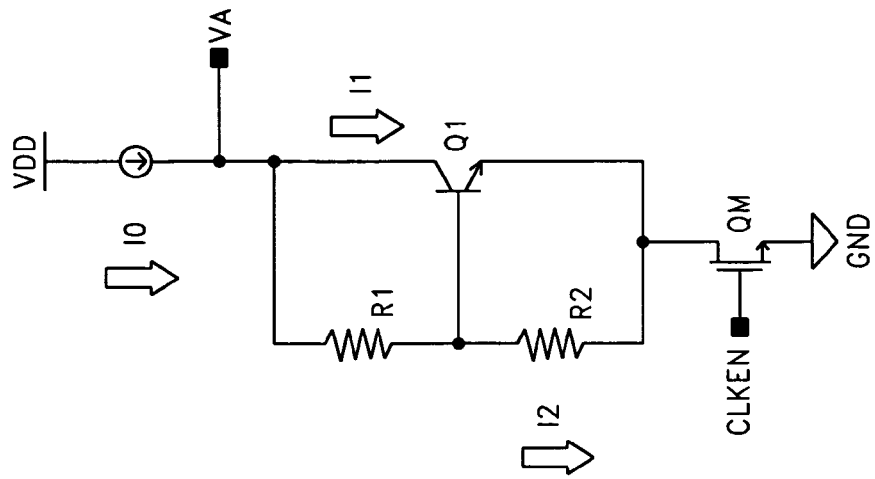
FIG. 2B illustrates example voltage reference circuits that can be used with the clock generator circuit of FIG. 2A.

An example embodiment of the refresh clock circuit 102 is illustrated in greater detail in FIG. 2A, however, other circuits and circuit topologies can be used. In the illustrated embodiment, the refresh clock circuit 102 is provided with a significant temperature dependency via a temperature sensitive voltage reference. The voltage reference can tune the temperature coefficient for REFV. FIG. 2B illustrates two example temperature sensitive voltage references, a diode string and a $V_{BE}$ multiplier circuit, although other temperature sensitive voltage reference circuits can be used as well. For the example implementations, the bias current $I_0$ is preferably kept small because the bias current $I_0$ will contribute to the standby current Icc.

The diode string voltage reference includes a plurality of diodes D1–DN. In particular, in the illustrated example, the anode of the diode D1 is connected to voltage reference output VA, and to voltage VDD via Io. The voltage reference output VA can be coupled to the signal REFV illustrated in FIG. 2A. The D1 cathode is connected to the anode of D2, and the D2 cathode is connected to the anode of the next diode in the string, and so on. The cathode of diode DN is connected to the source of transistor QD. The drain of the transistor QD is connected to ground and the gate is connected to clock enable signal CLKEN.

Each of the diodes has an associated forward voltage drop. By way of example, silicon diodes often have forward voltage drops $V_d$ of about 0.7 volts at room temperature, though diodes with other forward voltage drops can be used as well. One embodiment has three diodes in the string, although embodiments can have fewer or more diodes than the illustrated three diodes. The diodes can optionally be formed using transistors or other circuit elements.

In this example, the diodes D1–DN have a negative temperature coefficient. In other embodiments, not all diodes used to set the voltage reference need to have a negative coefficient. Advantageously, diodes can have greater temperature sensitivity as compared to polysilicon resistors. In addition, the controllability of the temperature coefficient for a diode can be better than that of a polysilicon resistor. For example, the diodes D1–DN illustrated in FIG. 2B can each have a negative temperature coefficient of approximately –2 mv/° C. to –2.5 mv/° C., though higher or lower temperature coefficients can be used as well. The desired temperature coefficient can be achieved with an appropriate selection of components and circuit topologies. Thus, as the temperature increases, the output voltage VA, and hence the reference voltage REFV, set by the series connected diodes D1–DN, decreases. As will be described, this causes the circuit to generate a higher frequency at a higher temperature.

Two example alternatives, a diode string implementation and a $V_{BE}$-multiplier based implementation, will now be described which can be used to tune the temperature coefficient for REFV, as illustrated in FIG. 2B. Preferably, in both implementations, the I0 bias current is kept as small as possible because the IO current will contribute to Icc standby current.

With respect to diode string voltage reference, and neglecting the voltage drop of the transistor QD:

$$VA = N \times Vd$$

$$\partial VA/\partial T = N \times \partial Vd/\partial T \approx -2 \times N \text{ mv/° C.}$$

The $V_{BE}$-multiplier voltage reference circuit includes a transistor Q1 whose source is coupled to resistor R1, to voltage VDD via Io, and to voltage reference output VA. The voltage reference output VA can be coupled to the signal REFV illustrated in FIG. 2A. The gate of transistor Q1 is coupled to the other terminal of resistor R1 and to resistor R2. The drain of transistor A1 is coupled to the other terminal of resistor R2 and to the source of transistor QM. The drain of transistor QM is coupled to ground and the gate is coupled to clock enable circuit CLKEN.

The $V_{BE}$-multiplier voltage reference circuit can provide an output voltage VA that is arbitrary multiple of transistor base-emitter drop. In this example, the transistor QM base-emitter voltage $V_{BE}$ has a negative temperature coefficient.

The voltage drop across the resistor R2 is constrained to be equal to the transistor Q1 $V_{BE}$, assuming that the base current of transistor is negligible, and the current through resistor R2 is substantially the same as the current through R1. Therefore, the output voltage VA is related to transistor $V_{BE}$ as $$VA=I2\times(R1+R2)=V_{BE}\times(1+R1/R2)$$

$$\partial VA/\partial T=\partial Vbe/\partial T\times(1+R1/R2)\approx -2\times(1+R1/R2)\text{mv}/^\circ\text{ C}.$$

Thus, as the temperature increases, the output voltage VA, and hence the reference voltage REFV, set by the $V_{BE}$ of the transistor QM.

With reference to FIG. 2A, the clock enable signal CLKEN is connected to the input A of inverter X1O, and the gate of transistor MO. The source of the transistor MO is connected to the source and gate of the transistor M1, and the gate of the transistors M2 and M3. The gate of the transistor MXO is connected to ground, and the drain is connected to VDD. The gate of transistor MX1 is connected to the signal CKB (the output of the NAND gate AD1), and the drain is connected to VDD. The gate of transistor MX2 is connected to the signal CK (the output of the NAND gate AD2), and the drain is connected to VDD. The source of MX2 is connected to the drain of the transistor M3. The source of the transistor M2 is connected to the inverter X11 input. The source of the transistor M3 is connected to the inverter X12 input.

The two cross-coupled NAND gates AD1, AD2 act as a latch. When the signal CLKEN is a logic '0' the output of the NAND gate AD2 is forced to a logic '1', forcing the output of the signal CLKB to a logic '0'. In this case, output of NAND gate AD1 will be a logic '0' and the signal CLK will be at a logic '1' when the voltage V2 is at a logic '0'. When the signal CLKEN is a logic '1', the output of the NAND gate AD2 is forced to a logic '0', when the output of NAND gate AD1 is a logic 1, and the voltage V3 is at a logic '0' forcing the output of the signal CLKB is forced to a logic '0'. In this case, the signal CLK will be a logic '1' when the voltage V2 is at a logic '0'.

Figure 2B:
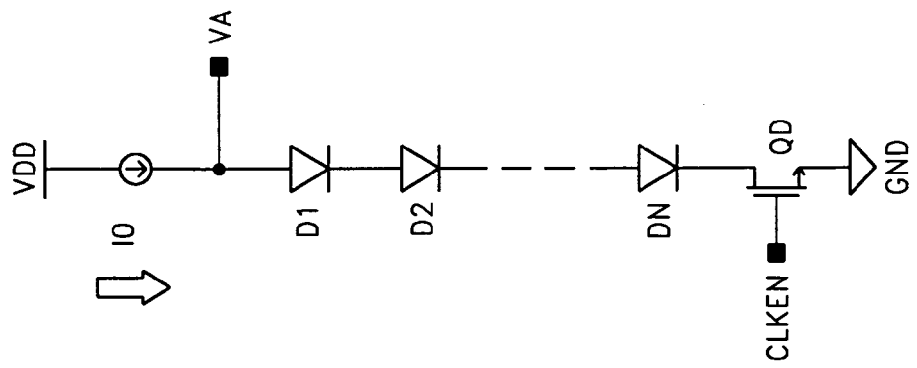

As illustrated in FIG. 2, there are two capacitors MC1 and MC0 respectively coupled to the drains of the transistors M5, M6. The source of transistor M5 is coupled to the input A of inverter X11, and well as the source of transistor M2.

When the clock enable signal CLKEN is at a logic '1', the transistor voltage reference transistor (QD or QM) is turned. The voltage REFV will be set by, in the case of the diode string voltage reference circuit, the forward voltage drops of the diodes D1–DN, and the voltage threshold of the transistor QD, or more simpiy, VA=N×Vd. If the VBE multiplier circuit is used, when the clock enable signal CLKEN is at a logic '0', REFV is approximately equal to VDD, thereby turning on the transistors M5, M6, which in turn causes the states of the CLK and the CLKB to toggle or pulse accordingly.

The ratio of capacitance of MC1 and MC0 is defined as "N". Of course, each capacitor can be formed using a plurality of capacitors connected in parallel. Thus, for example, if M=MC0, then the capacitor MC1 can comprise N*M capacitors. Transistor M5 and transistor M6 have substantially the same current flow. Because transistors M5 and M6 flow the same current, the ratio N is used to determine the ratio of two phases.

The refresh period Tref is determined by:

$$Tref=C*(REFV-Vth(m5))/I$$

The refresh frequency=1/Tref or $I/C*(REFV-Vth(m5))$

The standby period Tstb is determined by:

$$Tstb=N*C*(REFV-Vth(m6))/I$$

The standby frequency=1/Tstb or $I/N*C*(REFV-Vth(m6))$ where C is capacitance of MC0, and Vth is the transistor threshold. I is a relatively low bias current in order to reduce the total Icc standby current. Thus, the refresh period Tref decreases (and the refresh frequency correspondingly increases) as REFV (set by the series connected diodes D0, D1, D2) decreases, as will occur with increasing temperature. Similarly, the standby period Tstb decreases (and the standby frequency correspondingly increases) as REFV decreases as will occur with increasing temperature.

As temperature decreases, REFV will increase, and therefore the refresh period Tref and the standby period Tstb will likewise increase, and the refresh frequency and standby frequency will decrease. In addition, the refresh period Tref is proportional to the value of MC0, and the standby period Tstb is proportional to the ratio N, or when C=MC0, to MC1. With respect to FIG. 2A, the clock period for CLK Tperiod, is equal to Tref+Tstb.

Referring back to FIG. 1, the relationships over time of the signal AVA to the refresh clock, and the output of the read 4-phase clock circuit 122 are illustrated. In this example, the clock period is 116.4 microseconds, although other clock periods can be used as well. The voltage AVX has a delta from low to high of about 0.1 volts, although other delta voltages can be used.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than flash memory.

What is claimed is:

1. A non-volatile memory circuit that generates a positive temperature correlated clock frequency comprising:
    a voltage reference having a voltage defined at least in part by a diode having a negative temperature coefficient;
    a clock generator that generates a clock having a frequency that is based at least in part on the voltage reference voltage so that the clock frequency has a positive temperature correlation; and
    a memory charge pump which is turned off during a memory standby or power-down period, and is enabled at least in part by the clock to maintain a wordline at an operational voltage level during the memory standby or power-down period, so that a first read operation after the memory standby or power-down period is successful.

2. The memory circuit as defined in claim 1, wherein the voltage reference voltage decreases with an increase in temperature.

3. The memory circuit as defined in claim 1, wherein the diode has a turn on voltage that decreases with temperature.

4. The memory circuit as defined in claim 1, wherein the voltage reference voltage is defined by a plurality of series connected diodes.

5. The memory circuit as defined in claim 1, wherein the voltage reference voltage sets, at least in part, a refresh period and a standby period.

6. The memory circuit as defined in claim 1, wherein the clock generator causes a capacitance to be refreshed in accordance with the clock frequency.

7. The memory circuit as defined in claim 1, wherein the clock generator causes a capacitor charge to be refreshed, wherein the capacitor charge has an associated charge leakage correlated with temperature.

8. The memory circuit as defined in claim 1, wherein the clock generator causes a capacitor charge to be refreshed, wherein the capacitor is formed at least in part by a gate, a junction and a well.

9. The memory circuit as defined in claim 1, wherein the voltage reference sets a gate voltage for at least two transistors.

10. The memory circuit as defined in claim 1, further comprising:
a wordline coupled to the charge pump; and
a plurality of memory cells coupled to the wordline.

11. The memory circuit as defined in claim 1, wherein the voltage reference is generated by a circuit comprising:
a bias current source with one end electrically connected to power voltage $V_{DD}$;
a transistor having a drain electrically connected to ground; and
a plurality of series connected diodes in a string, wherein an anode of a first diode is electrically connected to other end of the bias current source and provides the voltage reference, a cathode of a diode in the string is electrically connected to an anode of a next diode, a cathode of a last diode in the string is electrically connected to a source of the transistor.

12. The memory circuit as defined in claim 1, wherein the voltage reference is generated by a circuit comprising:
a bias current source with one end electrically connected to power voltage $V_{DD}$;
a first resistor;
a second resistor;
a first transistor with a source electrically connected to other end of the bias current source, to one end, of the first resistor, and provides the voltage reference, wherein gate of the first transistor is electrically connected to other end of the first resistor, to one end of the second resistor, wherein a drain of the first transistor is electrically connected to other end of the second resistor; and
a second transistor with a source electrically connected to the drain of the first transistor, and with a drain electrically connected to ground.

13. A non-volatile memory circuit, comprising:
a voltage reference having a voltage defined at least in part by a diode having a negative temperature coefficient; and
a clock generator that generates a clock having a frequency that is based at least in part on the voltage reference voltage so that the clock frequency has a positive temperature correlation.

14. The circuit as defined in claim 13, further comprising:
a charge pump which is turned off during a memory standby or power-down period, and is enabled by the clock generator to maintain a wordline at an operational voltage level during the memory standby or power-down period, so that a first read operation after the memory standby or power-down period is successful;
a wordline coupled to the charge pump; and
a plurality of memory cells coupled to the wordline.

15. The circuit as defined in claim 13, wherein the voltage reference voltage decreases with an increase in temperature.

16. The circuit as defined in claim 13, wherein the diode has a turn on voltage that decreases with temperature.

17. The circuit as defined in claim 13, wherein the voltage reference voltage is defined by a plurality of series connected diodes.

18. The circuit as defined in claim 13, wherein the voltage reference voltage sets, at least in part, a refresh period and a standby period.

19. The circuit as defined in claim 13, wherein the clock generator causes a capacitance to be refreshed in accordance with the clock frequency.

20. The circuit as defined in claim 13, wherein the clock generator causes a capacitor charge to be refreshed, wherein the capacitor charge has an associated charge leakage correlated with temperature.

21. The circuit as defined in claim 13, wherein the clock generator causes a capacitor charge to be refreshed, wherein the capacitor is formed at least in part by a gate, a junction and a well.

22. The circuit as defined in claim 13, wherein the voltage reference sets a gate voltage for at least two transistors.

23. The circuit as defined in claim 13, wherein the voltage reference is generated by a circuit comprising:
a bias current source with one end electrically connected to power voltage $V_{DD}$;
a transistor having a drain electrically connected to ground; and
a plurality of series connected diodes in a string, wherein an anode of a first diode is electrically connected to other end of the bias current source and provides the voltage reference, a cathode of a diode in the string is electrically connected to an anode of a next diode, a cathode of a last diode in the string is electrically connected to a source of the transistor.

24. The circuit as defined in claim 13, wherein the voltage reference is generated by a circuit comprising:
a bias current source with one end electrically connected to power voltage $V_{DD}$;
a first resistor;
a second resistor;
a first transistor with a source electrically connected to other end of the bias current source, to one end of the first resistor, and provides the voltage reference, wherein gate of the first transistor is electrically connected to other end of the first resistor, to one end of the second resistor, wherein a drain of the first transistor is electrically connected to other end of the second resistor; and
a second transistor with a source electrically connected to the drain of the first transistor, and with a drain electrically connected to ground.

25. A flash memory device, comprising: EEPROM cells;
a plurality of wordlines coupled to the EEPROM cells;
a standby charge pump which is turned off during a memory standby or power-down period, and is coupled to the wordlines to generate a wordline voltage for a read operation to maintain the wordline at an operational voltage level during the memory standby or power-down period, so that a first read operation after the memory standby or power-down period is successful;

a voltage reference having a voltage defined at least in part by a diode having a forward voltage with a negative temperature coefficient or a transistor having a base emitter voltage with a negative temperature coefficient; and a clock circuit that provides a clock having a temperature dependent refresh period and a temperature dependent standby period based at least in part on the voltage reference voltage.

26. The device as defined in claim 25, wherein the diode has a turn on voltage that decreases with temperature.

27. The device as defined in claim 25, wherein the voltage reference voltage is defined by a plurality of series connected diodes.

28. The device as defined in claim 25, further comprising a transistor base-emitter voltage multiplier circuit coupled to the transistor.

29. The device as defined in claim 25, wherein the standby period is further defined at least in part by a capacitor value.

30. The device as defined in claim 25, wherein the clock generator causes a capacitor charge to be refreshed, wherein the capacitor charge has an associated charge leakage correlated with temperature.

31. The device as defined in claim 25, wherein the voltage reference is generated by a circuit comprising:
a bias current source with one end electrically connected to power voltage $V_{DD}$;
a transistor having a drain electrically connected to ground; and
a plurality of series connected diodes in a string, wherein an anode of a first diode is electrically connected to other end of the bias current source and provides the voltage reference, a cathode of a diode in the string is electrically connected to an anode of a next diode, a cathode of a last diode in the string is electrically connected to a source of the transistor.

32. The device as defined in claim 25, wherein the voltage reference is generated by a circuit comprising:
a bias current source with one end electrically connected to power voltage $V_{DD}$;
a first resistor;
a second resistor;
a first transistor with a source electrically connected to other end of the bias current source, to one end of the first resistor, and provides the voltage reference, wherein gate of the first transistor is electrically connected to other end of the first resistor, to one end of the second resistor, wherein a drain of the first transistor is electrically connected to other end of the second resistor; and
a second transistor with a source electrically connected to the drain of the first transistor, and with a drain electrically connected to ground.

33. A non-volatile memory circuit that generates a positive temperature correlated clock frequency comprising:
a voltage reference having a voltage defined at least in part by a transistor having a base-emitter voltage with negative temperature coefficient;

a clock generator that generates a clock having a frequency that is based at least in part on the voltage reference voltage so that the clock frequency has a positive temperature correlation; and a memory charge pump which is turned off during a memory standby or power-down period, and is enabled at least in part by the clock to maintain a wordline at an operational voltage level during the memory standby or power-down period, so that a first read operation after the memory standby or power-down period is successful.

34. The memory circuit as defined in claim 33, wherein the voltage reference voltage decreases with an increase in temperature.

35. The memory circuit as defined in claim 33, wherein the transistor is part of a $V_{BE}$ multiplier circuit including a first resistor and a second resistor, wherein the voltage is defined at least in part by the transistor base-emitter voltage and the ratio of the first resistor and the second resistor.

36. The memory circuit as defined in claim 33, wherein the transistor is part of a circuit including a first resistor R1 and a second resistor R2, wherein the voltage is further defined at least in part by (1+R1/R2).

37. The memory circuit as defined in claim 33, wherein the voltage reference voltage sets, at least in part, a refresh period and a standby period.

38. The memory circuit as defined in claim 33, wherein the clock generator causes a capacitance to be refreshed in accordance with the clock frequency.

39. The memory circuit as defined in claim 33, wherein the clock generator causes a capacitor charge to be refreshed, wherein the capacitor charge has an associated charge leakage correlated with temperature.

40. The memory circuit as defined in claim 33, further comprising:
a wordline coupled to the charge pump; and
a plurality of memory cells coupled to the wordline.

41. The memory circuit as defined in claim 33, wherein the voltage reference is generated by a circuit comprising:
a bias current source with one end electrically connected to power voltage $V_{DD}$;
a first resistor;
a second resistor;
a first transistor with a source electrically connected to other end of the bias current source, to one end of the first resistor, and provides the voltage reference, wherein gate of the first transistor is electrically connected to other end of the first resistor, to one end of the second resistor, wherein a drain of the first transistor is electrically connected to other end of the second resistor; and
a second transistor with a source electrically connected to the drain of the first transistor, and with a drain electrically connected to ground.

* * * * *